United States Patent
Yoo et al.

(10) Patent No.: US 8,829,565 B1
(45) Date of Patent: Sep. 9, 2014

(54) HIGH VOLTAGE ELECTROSTATIC DISCHARGE PROTECTION DEVICE

(71) Applicant: Dongbu Hitek Co., Ltd., Seoul (KR)

(72) Inventors: Jae Hyun Yoo, Bucheon-si (KR); Jong Min Kim, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 0 days.

(21) Appl. No.: 13/832,003

(22) Filed: Mar. 15, 2013

(30) Foreign Application Priority Data

Feb. 19, 2013 (KR) .................. 10-2013-0017592

(51) Int. Cl.
| | |
|---|---|
| *H01L 29/72* | (2006.01) |
| *H01L 29/74* | (2006.01) |
| *H01L 31/111* | (2006.01) |
| *H01L 29/73* | (2006.01) |
| *H01L 29/36* | (2006.01) |
| *H01L 23/62* | (2006.01) |
| *H01L 29/87* | (2006.01) |
| *H01L 29/66* | (2006.01) |

(52) U.S. Cl.
CPC .......... *H01L 29/87* (2013.01); *H01L 29/66121* (2013.01)
USPC ........... 257/173; 257/109; 257/174; 257/355; 257/E29.181

(58) Field of Classification Search
CPC ............ H01L 27/0248; H01L 27/0255; H01L 27/0262; H01L 27/0928; H01L 29/66121
USPC .................... 257/109, 173, 174, 355, E29.181
See application file for complete search history.

(56) References Cited

U.S. PATENT DOCUMENTS

| | | | | |
|---|---|---|---|---|
| 5,182,220 | A | * | 1/1993 | Ker et al. ............... 438/200 |
| 5,530,612 | A | * | 6/1996 | Maloney ................. 361/56 |
| 5,895,940 | A | * | 4/1999 | Kim ...................... 257/173 |
| 5,903,420 | A | * | 5/1999 | Ham ....................... 361/56 |
| 6,400,542 | B1 | * | 6/2002 | Lee et al. ................. 361/56 |
| 6,768,619 | B2 | * | 7/2004 | Ker et al. ................. 361/56 |
| 6,919,604 | B2 | * | 7/2005 | Lai et al. ............... 257/362 |
| 7,414,287 | B2 | * | 8/2008 | Pendharkar et al. .... 257/341 |
| 7,643,258 | B2 | * | 1/2010 | Lai et al. ................. 361/56 |
| 7,719,806 | B1 | * | 5/2010 | Boyd et al. ............... 361/56 |
| 7,880,195 | B2 | * | 2/2011 | Ker et al. ............... 257/173 |

(Continued)

FOREIGN PATENT DOCUMENTS

| | | |
|---|---|---|
| KR | 10-2007-0032627 A | 3/2007 |
| KR | 10-2008-0061004 A | 7/2008 |
| KR | 10-0971215 B1 | 7/2010 |
| KR | 10-1131320 B1 | 4/2012 |

OTHER PUBLICATIONS

Office Action dated Jan. 27, 2014 in Korean Application No. 10-2013-0017592.

(Continued)

*Primary Examiner* — Ida M Soward
(74) *Attorney, Agent, or Firm* — Saliwanchik, Lloyd & Eisenschenk

(57) ABSTRACT

An electrostatic discharge protection device is provided. The electrostatic discharge protection device can include a semiconductor substrate having a first well and a second well, a silicon controller rectifier (SCR) device, and first and second impurity areas disposed on the first and second wells to form a PN junction. The SCR can have a PNPN structure or an NPNP structure, and the PN junction structure and the SCR device can be alternately disposed when the substrate is viewed from above.

9 Claims, 7 Drawing Sheets

(56) References Cited

U.S. PATENT DOCUMENTS

| | | | |
|---|---|---|---|
| 7,910,951 B2* | 3/2011 | Vashchenko | 257/175 |
| 7,973,334 B2* | 7/2011 | Verleye et al. | 257/173 |
| 8,194,369 B2* | 6/2012 | Okushima | 361/56 |
| 2006/0081935 A1* | 4/2006 | Morishita | 257/361 |
| 2007/0131965 A1* | 6/2007 | Kim et al. | 257/173 |
| 2007/0246740 A1* | 10/2007 | Yu et al. | 257/173 |
| 2011/0019317 A1* | 1/2011 | Vinson | 361/18 |
| 2011/0210418 A1* | 9/2011 | Esmark | 257/517 |
| 2012/0074539 A1* | 3/2012 | Yu et al. | 257/659 |
| 2012/0104459 A1* | 5/2012 | Huang | 257/173 |
| 2012/0200964 A1* | 8/2012 | Van Camp et al. | 361/56 |
| 2013/0240992 A1* | 9/2013 | Gossner et al. | 257/347 |
| 2013/0330884 A1* | 12/2013 | Salcedo et al. | 438/133 |
| 2013/0341676 A1* | 12/2013 | Lee et al. | 257/148 |
| 2014/0027815 A1* | 1/2014 | Su et al. | 257/146 |

OTHER PUBLICATIONS

Notice of Allowance dated Mar. 31, 2014 in Korean Application No. 10-2013-0017592.

* cited by examiner

PRIOR ART

HIGH VOLTAGE ELECTROSTATIC DISCHARGE PROTECTION DEVICE

CROSS-REFERENCE TO RELATED APPLICATIONS

This application claims the benefit under 35 U.S.C. §119 of Korean Patent Application No. 10-2013-0017592, filed Feb. 19, 2013, which is hereby incorporated by reference in its entirety.

BACKGROUND

Recently, as semiconductor manufacturing process technology develops rapidly, a semiconductor chip for high voltage using a bipolar CMOS DMOS (BCD) process becomes smaller and more highly integrated. An electrostatic discharge (ESD) phenomenon in such a semiconductor chip causes the breakdowns of integrated circuit (IC) internal devices and metal wires, as well as circuit malfunctions due to electrostatic that is generated when electronic components and products are manufactured or in use and instantaneously discharged. Therefore, the ESD phenomenon is a very important factor to consider in the field of IC design. An electrical level of an ESD pulse applied to such a chip is very high, such as several kilovolts or several amperes, so that a device destruction phenomenon due to ESD can be very serious.

The requirement of an ESD immunity level is increased from 2 kV to 4 kV or 8 kV based on a human body model (HBM). As a result, an ESD phenomenon is one of the main factors that destroys an internal circuit device and greatly deteriorates the operation and yield of a chip, so that chips having high ESD immunity become competitive.

When a chip having a high voltage operation area is developed (for example, a BCD process), a latch-up free high voltage ESD device is typically developed in order to inhibit the operation of an ESD device in a high voltage operation area. Due to the high specifications of latch-up free and immunity level, the size of an ESD device is increased and this becomes a failure factor in minimizing a chip. The miniaturization of a high voltage ESD device is therefore a main factor in how competitive the ESD device is.

A commonly known ESD protection circuit technology in relation to the miniaturization of an ESD device includes an ESD protection device having a silicon controller rectifier (SCR) structure.

FIG. 1 shows a related art SCR structure, Referring to FIG. 1, a p+ diffusion area 51 of an SCR in an N well 50 is connected to an anode 30, and an n+ diffusion area 61 in a P well 60 is connected to a cathode 40 of an SCR. FIG. 3 shows an SCR characteristic curve according to a change of an anode voltage in such an ESD protection device, and its operation principle is as follows.

Referring again to FIG. 1, a voltage of the anode 30 drops in the N well 50) due to a pnp base current flowing through the N well 50, and when the voltage of the anode 30 becomes higher than that below an emitter, the emitter-base junction of a pnp transistor becomes a forward bias state and the pnp transistor is turned on. At this point, current flowing through the pnp transistor 10 flows into the P well 60, and due to this current, an npn transistor is turned on.

A current of an npn transistor flowing from the N well 50 to the cathode applies forward bias to the pnp transistor, and therefore, the SCR is triggered by the two turned on transistors (refer to A of FIG. 3). Through this, since there is no need to hold the bias in the pnp transistor, a voltage of the anode 30 is reduced to a minimum or near minimum value, and this is called holding voltage (refer to B of FIG. 3).

Then, the SCR performs a feedforward operation in order to effectively discharge an ESD current applied through the anode 30.

The ESD protection device further enhances current drivability conditions and latch-up free requirements, in which an ESD device does not operate in an operating voltage area, and also its size becomes smaller.

BRIEF SUMMARY

Embodiments of the subject invention provide an electrostatic discharge protection device satisfying latch-up free requirements in which an ESD device does not operate in an operating voltage area without increasing the size of an ESD protection device with an SCR structure and a method of manufacturing the electrostatic discharge protection device.

In an embodiment, an electrostatic discharge protection device can include: a semiconductor substrate having a first well and a second well; a silicon controller rectifier (SCR) device disposed on the first well and the second well, wherein the SCR device has a PNPN structure or an NPNP structure; a first impurity area doped with a p-type impurity and disposed at both sides of an N+ area defining the SCR device; and a second impurity area doped with an n-type impurity and disposed at both sides of a P+ area defining the SCR device. The first impurity area can be disposed on the first well and the second impurity area can be disposed on the second well in order to form a PN junction, and the PN junction structure formed by the first and second impurity areas and the SCR device can be alternately disposed when the substrate is viewed from above.

In another embodiment, an electrostatic discharge protection device can include: a semiconductor substrate having a first well and a second well; an SCR device having a PNPN structure and disposed on the first and second wells; and a diode device having an NP structure and disposed at both sides of the SCR device. When the substrate is viewed from above, the diode device and the SCR device can be alternately disposed.

In yet another embodiment, a method of fabricating an electrostatic discharge protection device can include: forming a first well and a second well in a semiconductor substrate; forming a silicon controller rectifier (SCR) device on the first well and the second well, wherein the SCR device has a PNPN structure or an NPNP structure; forming a first impurity area doped with a p-type impurity at both sides of an N+ area defining the SCR device; and forming a second impurity area doped with an n-type impurity at both sides of a P+ area defining the SCR device. The first impurity area can be disposed on the first well and the second impurity area can be disposed on the second well in order to form a PN junction, and the PN junction structure formed by the first and second impurity areas and the SCR device can be alternately disposed when the substrate is viewed from above.

In yet another embodiment, a method of fabricating an electrostatic discharge protection device can include: forming a first well and a second well in a semiconductor substrate; forming an SCR device having a PNPN structure on the first and second wells; and forming a diode device having an NP structure at both sides of the SCR device. When the substrate is viewed from above, the diode device and the SCR device can be alternately disposed.

DETAILED DESCRIPTION OF THE EMBODIMENTS

Reference will now be made in detail to the embodiments of the present disclosure, examples of which are illustrated in the accompanying drawings.

When the terms "on" or "over" are used herein, when referring to layers, regions, patterns, or structures, it is understood that the layer, region, pattern, or structure can be directly on another layer or structure, or intervening layers, regions, patterns, or structures may also be present. When the terms "under" or "below" are used herein, when referring to layers, regions, patterns, or structures, it is understood that the layer, region, pattern, or structure can be directly under the other layer or structure, or intervening layers, regions, patterns, or structures may also be present.

Figure 1:
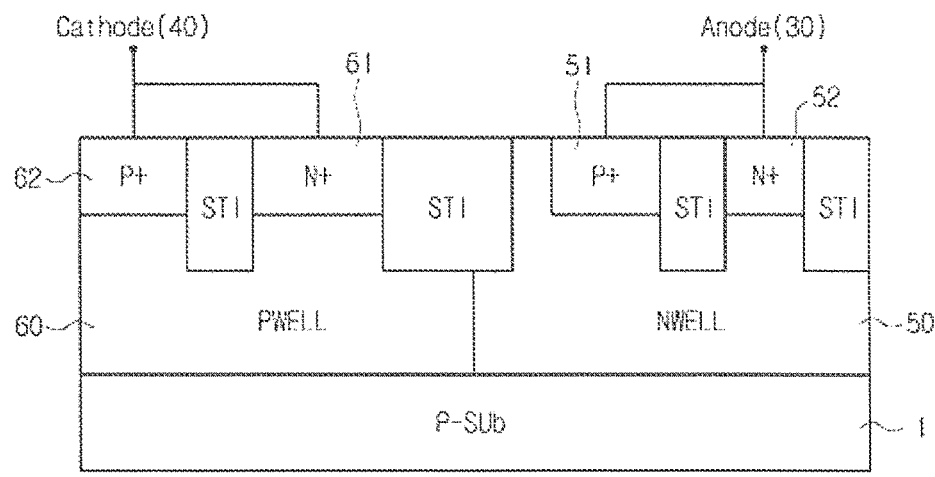
FIG. 1 is a cross-sectional view of a related art silicon controller rectifier (SCR).
Figure 2:
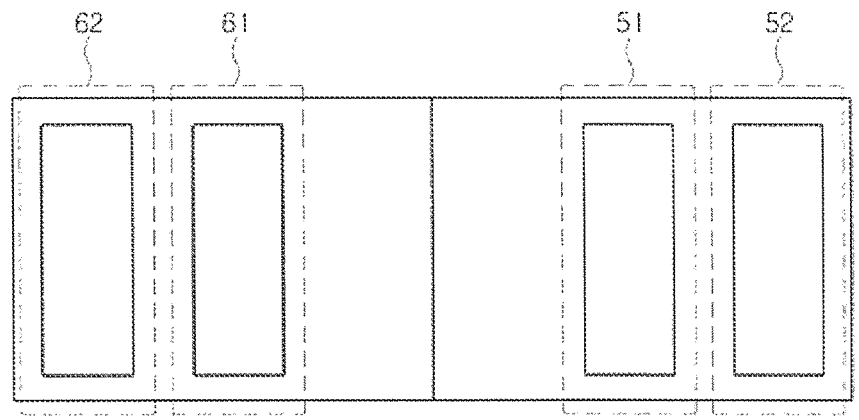
FIG. 2 is a plan view of a doping area connected to a cathode and an anode of the SCR of FIG. 1.
Figure 3:
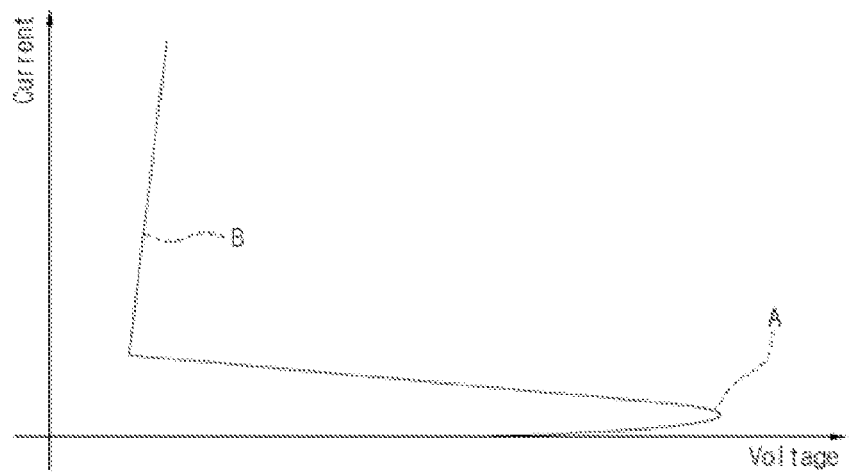
FIG. 3 is a graph illustrating SCR characteristic curves according to a change of an anode voltage in a related art ESD protection device.
Figure 4:
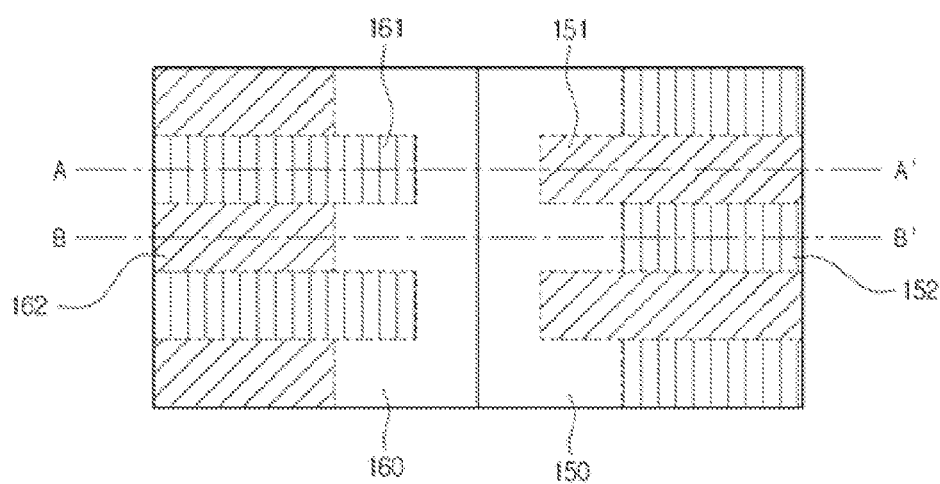
FIG. 4 is a plan view of a protection device according to an embodiment of the subject invention.
Figure 5:
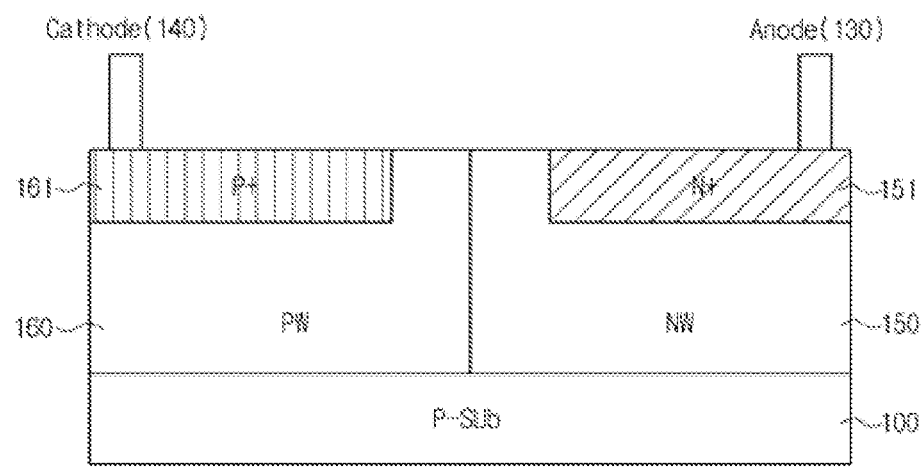
FIG. 5 is a cross-sectional view taken along line A-A' of FIG. 4.

FIG. 4 is a plan view of a protection device according to an embodiment of the subject invention. FIG. 5 is a cross-sectional view taken along line A-A' of FIG. 4, and FIG. 6 is a cross-sectional view taken along line B-B' of FIG. 4.

In an embodiment, an electrostatic discharge (ESD) protection device can have a doping area of a silicon controller rectifier (SCR) structure with, for example, a PNPN or NPNP structure. Each PN diode can be formed at the upper and lower part of the SCR structure on a plane. Also, by controlling such a PN diode, a gain value of a bipolar transistor can be determined. That is, by controlling a design rule such as the size and doping amount of the PN diode, a resistance or gain, i.e., an infection rate of a bipolar transistor can be changed to increase the holding voltage.

Referring to FIG. 4, in an embodiment, an ESD protection device can be an SCR device of a PNPN (or NPNP) junction structure. An ESD protection device can have other configurations, and PNPN and NPNP are listed as exemplary only. The ESD device can include a second N+ area 162, a P well 160, an N well 150, and a second P+ area 152. Additionally, each PN diode device including a first P+ area 161 and a first N+ area 151 can be provided at the upper and lower part of the SCR device.

Figure 6:
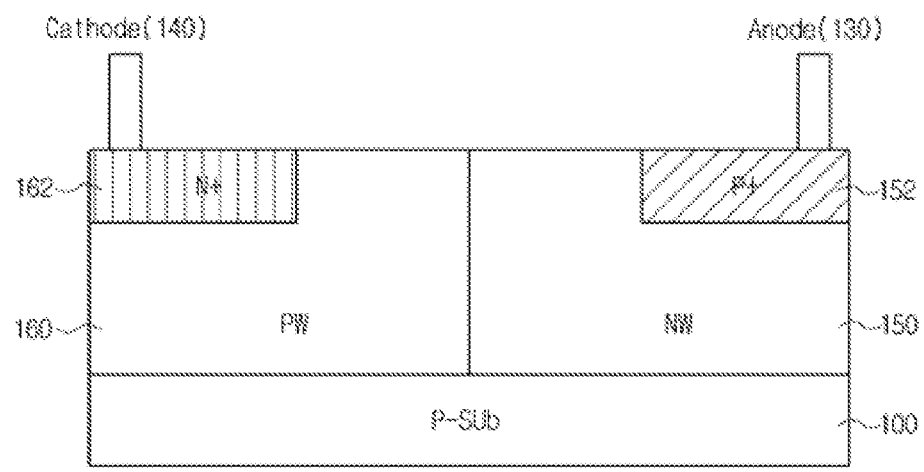
FIG. 6 is a cross-sectional view taken along line B-B' of FIG. 4.

Referring to FIGS. 4 to 6, the PN diode device including the first P+ area 161 and the first N+ area 151 and the SCR device having a PNPN (or NPNP) junction structure can be formed to cross each other. Also, the doping size of the first P+ area 161 and the first N+ area 151 constituting a PN diode device can be formed greater or less than the size of the second N+ area 162 and the second P+ area 152 constituting the SCR device.

In an embodiment, the P+ area and N+ area constituting a diode structure can be formed greater than that of the SCR device, and base resistance can be reduced, along with an injection rate of an emitter, thereby increasing a holding voltage of an ESD protection device. That is, in a PN diode structure, the P+ area and N+ area can both be high concentration doping areas, and due to this structure, a base resistance of an SCR device can be reduced. As the area of an SCR device is reduced due to the addition of the PN diode device, it is possible to control injection by controlling the area of the PN diode device.

A method of manufacturing an ESD protection device according to an embodiment will now be described.

A p-type impurity and an n-type impurity can be implanted on a semiconductor substrate 100 (e.g., a p-type semiconductor substrate) to form a P well 160 and an N well 150, respectively. Though a p-type semiconductor substrate is shown, embodiments are not limited thereto. Then, a doping area can be formed in the P well 160 to be connected to the cathode 140, and a doping area can be formed in the N well 150 to be connected to the anode 130.

In more detail, when the P well 160 and the N well 150 are formed, an impurity implantation process for forming a P+ doping area to configure an SCR device and an impurity implantation process for forming a P+ doping area to configure a PN diode device can be performed. Additionally, an impurity implantation process for forming an N+ doping area to configure an SCR device and an impurity implantation process for forming a N+ doping area to configure a PN diode device can be performed. The n-type impurity implantation process can be performed after a p-type impurity implantation process or vice versa.

Such an impurity implantation process can be performed in order to form the first P+ area 161 of the PN diode and the second P+ area 152 of the SCR device to be crossed according to a predetermined design rule. That is, an impurity implantation process can be performed by using a mask that allows the P+ area of an SCR device to be disposed in a diagonal direction to the P+ area of a PN diode. When an N-type impurity is implanted, as discussed above, the N+ area of an SCR device and the N+ area of a PN diode can also be disposed diagonal to each other.

Figure 7:
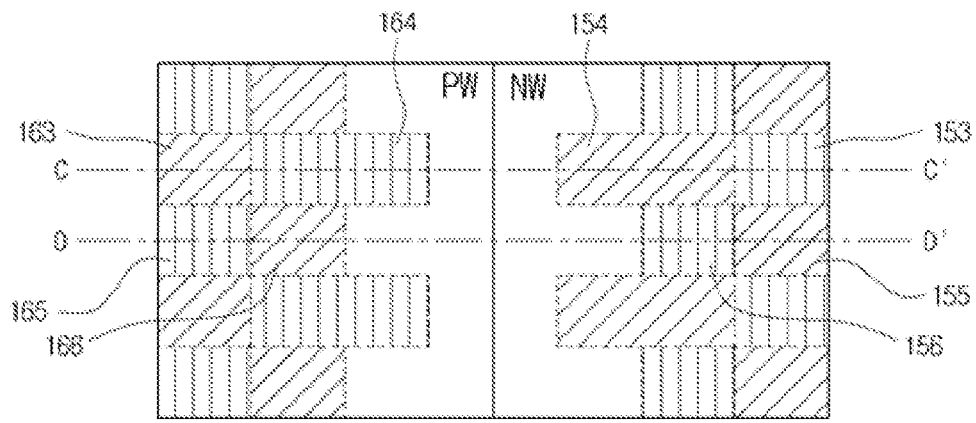
FIG. 7 is a plan view of a protection device according to an embodiment of the subject invention.
Figure 8:
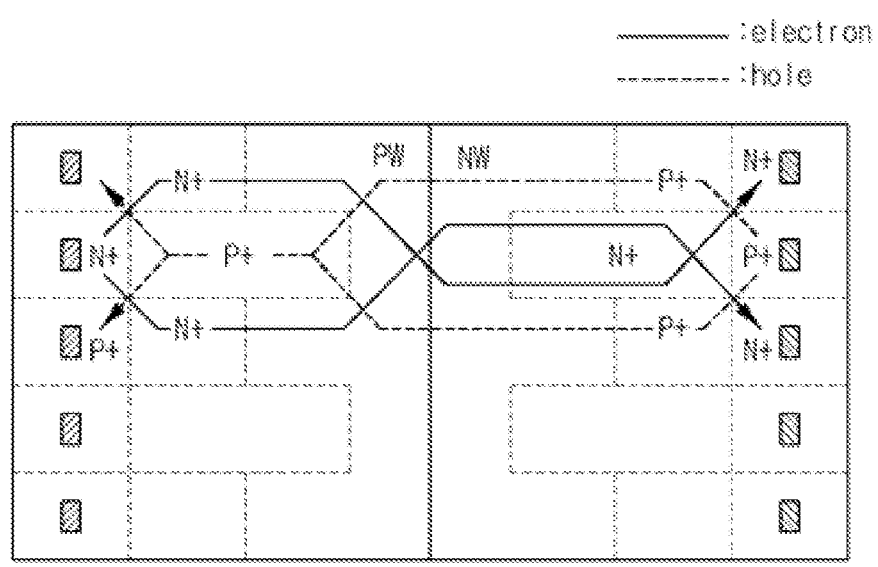
FIG. 8 is a plan view of a device according to an embodiment of the subject invention.
Figure 9:
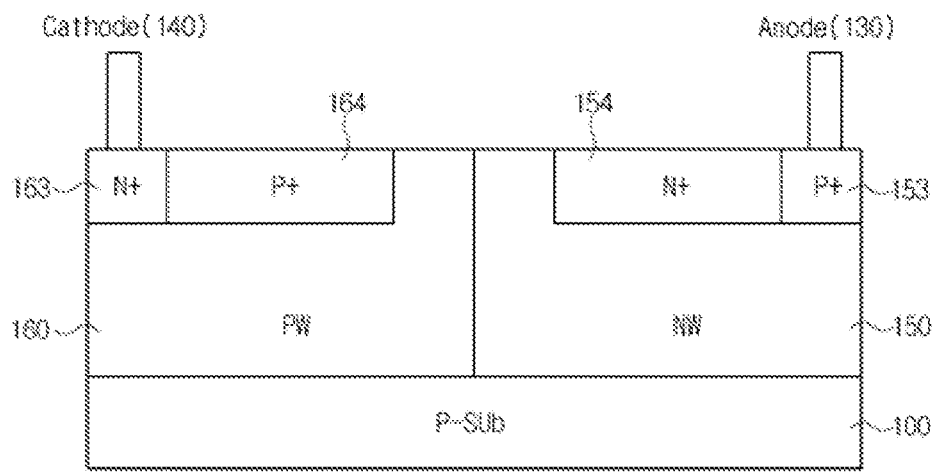
FIG. 9 is a cross-sectional view taken along line C-C' of FIG. 7.

FIG. 7 is a plan view of a protection device according to an embodiment of the subject invention. FIG. 8 is a plan view showing that breakdown voltage Vh can be increased when paths of hole current and electron current are separated. FIG. 9 is a cross-sectional view taken along line C-C' of FIG. 7, and FIG. 10 is a cross-sectional view taken along line D-D' of FIG. 7.

In an embodiment, a protection device can have a structure in which an SCR device (having a PNPN structure in which an N moat and a P moat are inserted) and a diode (having an NP structure in which a P moat and an N moat are inserted) are alternately disposed. FIG. 7 shows a plan view of such a protection device, and FIG. 8 shows its structure in more detail.

Figure 10:
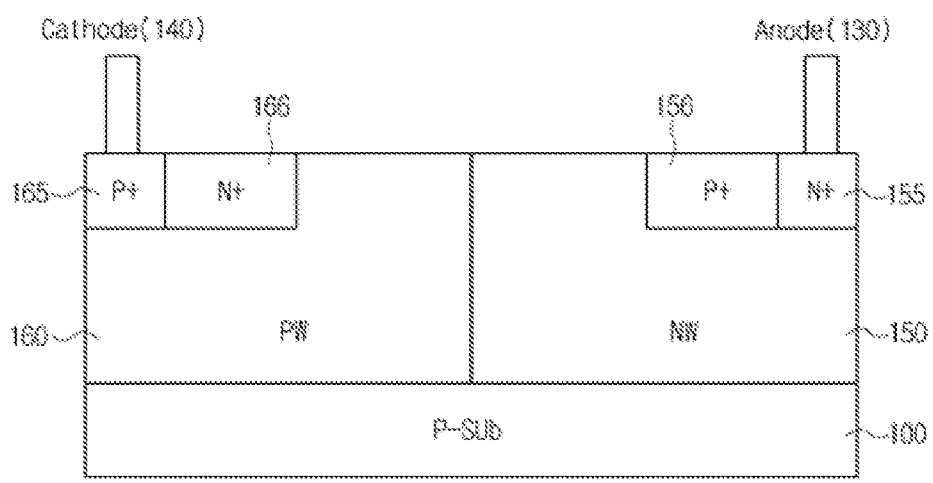
FIG. 10 is a cross-sectional view taken along line D-D' of FIG. 7.

Referring to FIGS. 7, 9, and 10, a protection device can include a P well 160 and an N well 150 formed by implanting a p-type impurity and an n-type impurity on a semiconductor substrate 100 (e.g., a p-type semiconductor substrate). The device can further include a first P+ area 153 (i.e., a doping area) formed by implanting a p-type impurity on the N well 150 to be connected to an anode 130, a first N+ area 154 formed by implanting an N-type impurity on the N well 150 to be disposed at one side of the first P+ area 153, a second N+ area 163 (i.e., a doping area) formed by implanting an n-type impurity on the P well 160 to be connected to a cathode 140, and a second P+ area 164 formed by implanting a p-type impurity on the P well 160 to be disposed at one side of the second N+ area 163.

An SCR device having a PNPN structure is shown in FIG. 9, which is the sectional view taken along line C-C' of FIG. 7. A diode device having an NP structure is shown in FIG. 10, which is the sectional view taken along line D-D' of FIG. 7.

Referring to FIG. 10, the diode device can include a P well 160 and an N well 150 formed by implanting a P-type impurity and an N-type impurity on a semiconductor substrate 100 (e.g., a p-type semiconductor substrate), a third N+ area 155 (i.e., a doping area) formed by implanting an n-type impurity on the N well 150 to be connected to the anode 130, and a third P+ area 156 formed by implanting a p-type impurity on the N well 150 to be disposed at one side of the third N+ area 155. The diode device can further include a fourth P+ area 165 (i.e., a doping area) formed by implanting a p-type impurity on the P well 160 to be connected to the cathode 140 and a fourth N+ area 166 formed by implanting an n-type impurity on the P well 160 to be disposed at one side of the fourth P+ area 165.

When viewed from above, the SCR device having a PNPN structure and the diode device having an NP structure are disposed to cross each other. That is, the diode device having an NP structure can be disposed below or on the SCR device having a PNPN structure.

The reason that breakdown voltage is increased due to such a structure will be described in relation to its operation.

In order to increase breakdown voltage (Vh) in an SCR (or a PNPN current path) structure, a base resistance of npn or pnp therein can be reduced, or injection from an emitter to a base of a minority carrier can be decreased. Referring to FIG. 8, an N+ moat connected to a contact in the P well 160 can be surrounded by a P+ moat. Therefore, the injection of the emitter can be decreased.

A base resistance of hole current that reduces electron injection from an N+ moat can be lowered by a P+ moat in front of an N+ moat and a P+ moat at the side the N+ moat. The same principle of such an operation can be applied to a P+ moat in the N well 150.

In a latch status, as shown in the dotted line, hole injection can occur from a P+ moat at the contact of an N well toward an N well, and can move toward a P well. A path of such a hole current can be formed toward a lower hole resistance side doped with a p-type impurity. On the contrary, electron injection can occur from an N+ moat at the contact of a P well toward a P well, and can move toward an N well. A path of such an electron current can be formed toward a lower electron resistance side doped with an n-type impurity.

In such a manner, the moving paths of holes and electrons can be separated from each other, and low base resistance and low emitter injection can be provided, thereby increasing breakdown voltage (Vh).

A method of manufacturing an ESD protection device according to an embodiment will now be described.

A p-type impurity and an n-type impurity are implanted on a semiconductor substrate 100 (e.g., a p-type semiconductor substrate) to form a P well 160 and an N well 150, respectively. Then, a doping area can be formed in the P well 160 to be connected to the cathode 140, and a doping area can be formed in the N well 150 to be connected to the anode 130.

During formation of the P well 160 and the N well 150, in order to form an SCR device having a PNPN structure and a diode device having an NP structure to cross each other, p-type and n-type impurity implantation processes can be performed.

During a p-type impurity implantation process, the first P+ area 153 can be formed in the N well 150 to be connected to the anode 130, and the second P+ area 164 can be formed in the P well 160 to lower a resistance at the cathode 140. Also, the fourth P+ area 165 connected to the cathode 140 and the third P+ area 156 to reduce a resistance at the anode 130 can be formed being spaced a predetermined distance apart from the first and second P+ areas 153 and 164.

During an n-type impurity implantation process, the first N+ area 154 for reducing a resistance of the anode 130 can be formed at the line where the second N+ area 163 connected to the cathode 140 is formed. Also, the third N+ area 155 connected to the anode 130 and the fourth N+ area 166 for reducing a resistance of the cathode 140 can be formed at both sides of the line where the first and second N+ areas 154 and 163 are formed.

Figure 11:
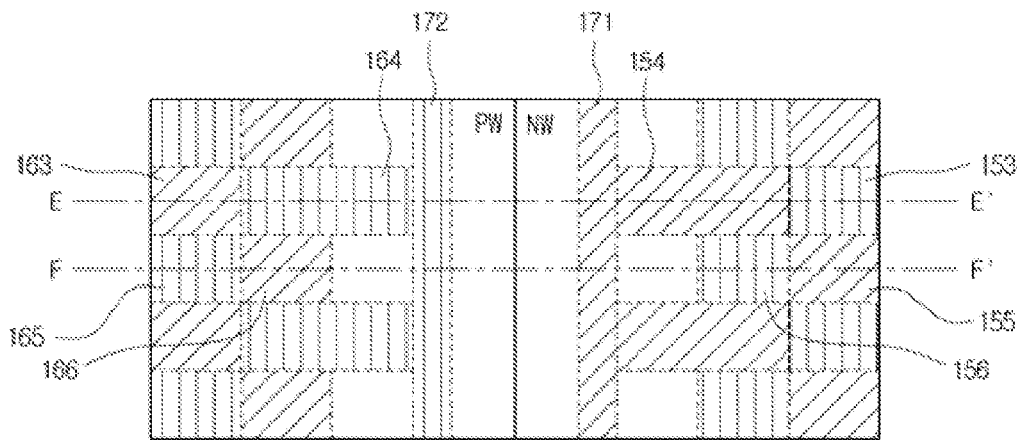
FIG. 11 is a plan view of a protection device according to an embodiment of the subject invention.
Figure 12:
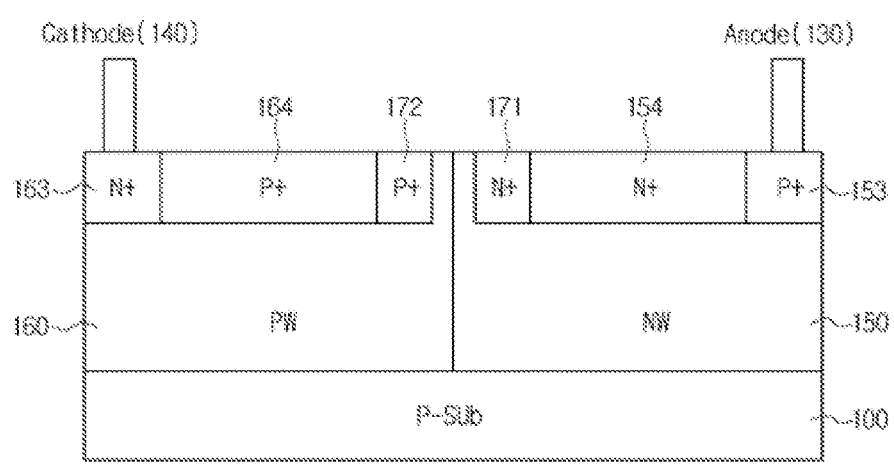
FIG. 12 is a cross-sectional view taken along line E-E' of FIG. 11.
Figure 13:
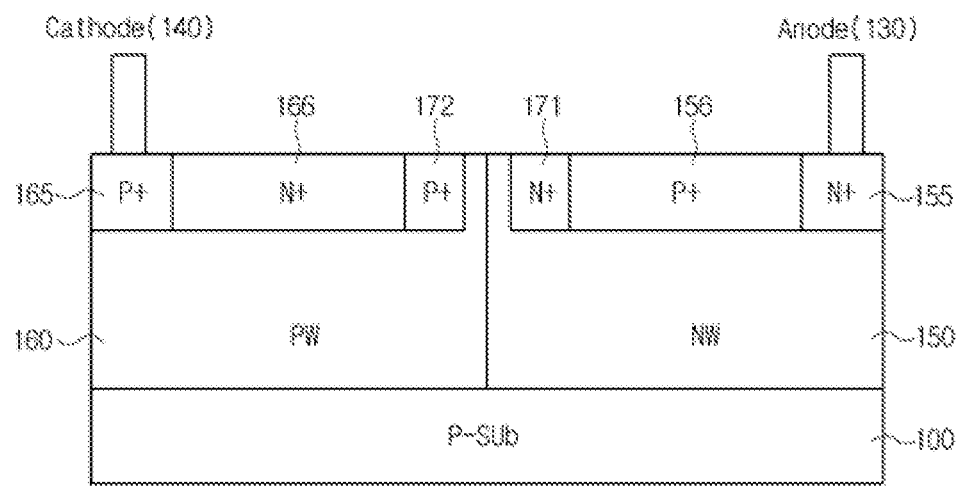
FIG. 13 is a cross-sectional view taken along line F-F' of FIG. 12.

FIG. 11 is a plan view of a protection device according to an embodiment of the present invention. FIG. 12 is a cross-sectional view taken along line E-E' of FIG. 11, and FIG. 13 is a cross-sectional view taken along line F-F' of FIG. 12.

In an embodiment, a protection device can have the same configuration for moving paths of holes and electrons as that according to the embodiment depicted in FIGS. 7-10. However, in order to allow smooth capturing of holes and electrons during hole and electron movement, a P+ doping line 172 for smoothly moving holes can be further formed at one side of the second P+ area 164 of the P well 160. Moreover, an N+ doping line 171 for smoothly moving electrons can be further formed at one side of the first N+ area 154 of the N well 150

When viewed from above, the N+ and P+ doping lines 171 and 172, as shown in FIG. 11, can be formed entirely over the SCR devices having a PNPN structure or an NPNP structure.

Figure 14:
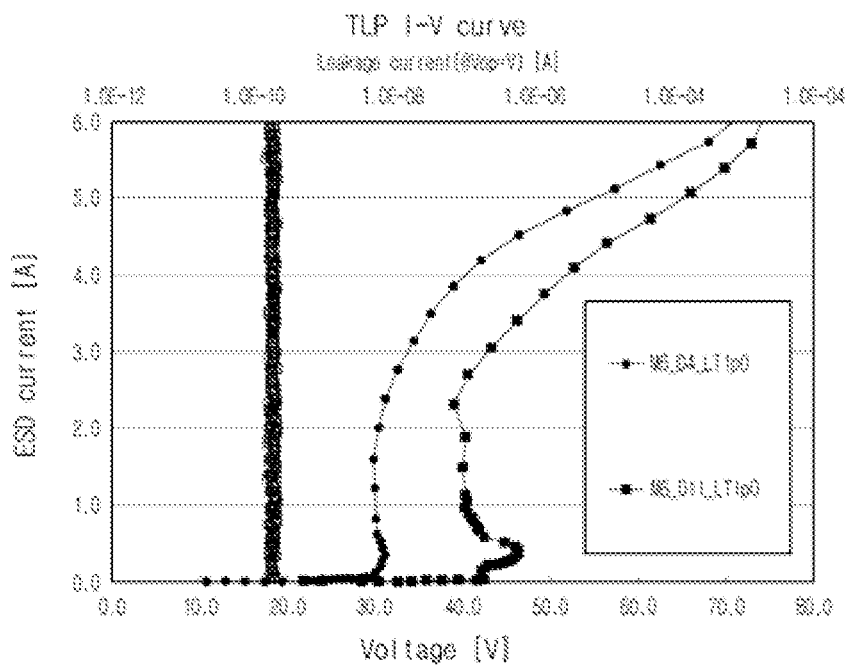
FIG. 14 is a graph showing voltage-current characteristics of a protection device according to an embodiment of the subject invention.

FIG. 14 is a graph showing voltage-current characteristics of a protection device according to an embodiment of the present invention.

Referring to FIG. 14, in relation to M6_D4_LT1p0, Vt1 is about 30.5 V, Vh is about 30 V, and It2 is greater than about 6 A. These may be used as requirements for latch-up free and more than HBM 4 kV in a high voltage design of about 20 V.

In relation to M6_D11_LT1p0, Vt1 is about 46.0 V, Vh is about 39.5 V, and It2 is greater than about 6 A. These may be used as requirements for latch-up free and more than HBM 4 kV in a high voltage design of about 30V. Such characteristics can be distinguished from those of a general SCR device having Vh of less than about 10 V, which is not applied to a high voltage design as latch-up free requirements.

In an electrostatic discharge protection device and a method of manufacturing the same according to embodiments of the present invention, an area where a device isolation layer is formed can be reduced, thereby allowing miniaturization to be achieved. Also, since high holding voltage can be provided, a stable operation can be maintained.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. An electrostatic discharge protection device comprising:
   a semiconductor substrate having a first well and a second well;
   an SCR device having a PNPN structure and disposed on the first and second wells; and
   a diode device having an NP structure and disposed at both sides of the SCR device,
   wherein, when the substrate is viewed from above, the diode device and the SCR device are alternately disposed, and
   wherein the diode device comprises:
      a third N+ area formed by implanting an n-type impurity on the second well to be connected to an anode;
      a third P+ area formed by implanting a p-type impurity on the second well and disposed at one side of the third N+ area;
      a fourth P+ area formed by implanting a p-type impurity on the first well to be connected to a cathode; and
      a fourth N+ area formed by implanting an n-type impurity on the first well and disposed at one side of the fourth P+ area.

2. The electrostatic discharge protection device according to claim 1, wherein the first well is a P well and the second well is an N well.

3. The electrostatic discharge protection device according to claim 1, further comprising a p+ doping line doped with a p-type impurity formed at one side of the second P+ area in order to allow capturing of moving holes.

4. The electrostatic discharge protection device according to claim 1, further comprising an N+ doping line doped with an n-type impurity formed at one side of the first N+ area in order to allow capturing of moving electrons.

5. The electrostatic discharge protection device according to claim 1, wherein the first well is a P well and the second well is an N well.

6. An electrostatic discharge protection device comprising:
   a semiconductor substrate having a first well and a second well;
   an SCR device having a PNPN structure and disposed on the first and second wells; and
   a diode device having an NP structure and disposed at both sides of the SCR device;
   wherein, when the substrate is viewed from above, the diode device and the SCR device are alternately disposed,
   wherein the SCR device comprises:
      a first P+ area formed by implanting a p-type impurity on the second well to be connected to an anode;
      a first N+ area formed by implanting an n-type impurity on the second well and disposed at one side of the first P+ area;
      a second N+ area formed by implanting an n-type impurity on the first well to be connected to a cathode; and
      a second P+ area formed by implanting a p-type impurity on the first well and disposed at one side of the second N+ area, and
   wherein the diode device comprises:
      a third N+ area formed by implanting an n-type impurity on the second well to be connected to an anode;
      a third P+ area formed by implanting a p-type impurity on the second well and disposed at one side of the third N+ area;
      a fourth P+ area formed by implanting a p-type impurity on the first well to be connected to a cathode; and
      a fourth N+ area formed by implanting an n-type impurity on the first well and disposed at one side of the fourth P+ area.

7. The electrostatic discharge protection device according to claim 6, wherein the first well is a P well and the second well is an N well.

8. The electrostatic discharge protection device according to claim 6, further comprising a p+ doping line doped with a p-type impurity formed at one side of the second P+ area in order to allow capturing of moving holes.

9. The electrostatic discharge protection device according to claim 6, further comprising an N+ doping line doped with an n-type impurity formed at one side of the first N+ area in order to allow capturing of moving electrons.

* * * * *